United States Patent [19]
Ipri

[11] Patent Number: 4,758,529
[45] Date of Patent: * Jul. 19, 1988

[54] METHOD OF FORMING AN IMPROVED GATE DIELECTRIC FOR A MOSFET ON AN INSULATING SUBSTRATE

[75] Inventor: Alfred C. Ipri, Hopewell Township, Mercer County, N.J.

[73] Assignee: RCA Corporation, Princeton, N.J.

[*] Notice: The portion of the term of this patent subsequent to Apr. 21, 2004 has been disclaimed.

[21] Appl. No.: 793,312

[22] Filed: Oct. 31, 1985

[51] Int. Cl.$^4$ .......................................... H01L 21/473
[52] U.S. Cl. ...................................... 437/40; 156/643; 156/662; 156/668; 156/657; 148/DIG. 150; 148/DIG. 81; 148/DIG. 118; 427/255; 437/83; 437/84; 437/82; 437/109; 437/914; 437/973; 357/23.7; 357/59 E; 357/59 G
[58] Field of Search ................... 29/571, 576 W, 578; 148/DIG. 150, DIG. 118, DIG. 122, DIG. 125; 357/23.7; 427/255.3, 86, 93; 437/83, 84, 82, 109, 914, 973, 40

[56] References Cited

U.S. PATENT DOCUMENTS

| | | | |
|---|---|---|---|
| 3,511,702 | 5/1970 | Jackson, Jr. et al. | 117/212 |
| 3,740,280 | 6/1973 | Ronen | 156/11 |
| 3,890,632 | 6/1975 | Ham et al. | 357/23 |
| 3,943,542 | 3/1976 | Ho et al. | 357/23 |
| 3,974,515 | 8/1976 | Ipri et al. | 357/23 |
| 4,002,501 | 1/1977 | Tamura | 148/1.5 |
| 4,016,016 | 4/1977 | Ipri | 148/175 |
| 4,076,573 | 2/1978 | Shaw et al. | 156/613 |
| 4,160,260 | 7/1979 | Weitzel et al. | 357/23 |
| 4,174,217 | 11/1979 | Flatley | 96/36.2 |
| 4,178,191 | 12/1979 | Flatley | 148/1.5 |
| 4,183,134 | 1/1980 | Oehler et al. | 29/571 |
| 4,199,384 | 4/1980 | Hsu | 148/174 |
| 4,199,773 | 4/1980 | Goodman et al. | 357/23 |
| 4,242,156 | 12/1980 | Peel | 148/175 |
| 4,252,582 | 2/1981 | Anantha et al. | 148/175 |
| 4,263,709 | 4/1981 | Wertzel et al. | 29/571 |
| 4,277,884 | 7/1981 | Hsu | 29/571 |
| 4,313,809 | 2/1982 | Benyon | 204/192 |
| 4,323,910 | 4/1982 | Sokoloski et al. | 357/23 |
| 4,341,569 | 7/1982 | Yaron et al. | 148/1.5 |
| 4,356,623 | 11/1982 | Hunter | 29/571 |
| 4,368,085 | 1/1983 | Peel | 148/33.3 |
| 4,385,937 | 5/1983 | Ohmura | 148/1.5 |
| 4,393,572 | 7/1983 | Policastro et al. | 29/571 |
| 4,393,578 | 7/1983 | Cady et al. | 29/576 |

(List continued on next page.)

FOREIGN PATENT DOCUMENTS

0179719 4/1986 European Pat. Off. .
56-19218 12/1981 Japan .
133667 8/1982 Japan .

OTHER PUBLICATIONS

Ansell et al., "CMOS in Radiation Environments," VLSI Systems, Sep. 1986, pp. 28-36.
Hughes et al., "Oxide Thickness Dependence of High-Energy-Electron—, VUV—, and Corona-Induced Charge in MOS Capacitors," Applied Physics Letters, vol. 29, No. 6, Sep. 15, 1976, pp. 377-379.
Naruke et al., "Radiation-Induced Interface States of Poly-Si Gate MOS Capacitors Using Low Temperature Gate Oxidation," IEEE Transactions on Nuclear Science, vol. NS-30, No. 6, Dec. 1983, pp. 4054-4058.
Saks et al., "Radiation Effects in MOS Capacitors with Very Thin Oxides at 80° K.," IEEE Transactions on Nuclear Science, vol. NS-31, No. 6, Dec. 1984, pp. 1249-1255.

(List continued on next page.)

*Primary Examiner*—Aaron Weisstuch
*Assistant Examiner*—Beverly A. Pawlikowski
*Attorney, Agent, or Firm*—Henry I. Steckler; Allen LeRoy Limberg

[57] ABSTRACT

A method for forming a silicon dioxide layer on a silicon island on an insulating substrate includes the steps of initially providing an insulating substrate having a major surface on which a silicon island is disposed. The surface of the silicon island is then thermally oxidized and a silicon layer is deposited on the oxidized island and the portion of the substrate surface adjacent to the island. This entire silicon layer is then oxidized and a conductive polycrystalline silicon electrode is deposited thereon.

8 Claims, 2 Drawing Sheets

U.S. PATENT DOCUMENTS

| | | | |
|---|---|---|---|
| 4,395,726 | 7/1983 | Maeguchi | 357/41 |
| 4,447,823 | 5/1984 | Maeguchi et al. | 357/23 |
| 4,455,738 | 6/1984 | Houston et al. | 29/571 |
| 4,472,459 | 9/1984 | Fisher | 427/93 |
| 4,491,856 | 1/1985 | Egawa et al. | 357/4 |
| 4,523,963 | 6/1985 | Ohta et al. | 148/1.5 |
| 4,533,934 | 8/1985 | Smith | 357/23.7 |
| 4,547,231 | 10/1985 | Hine | 148/175 |
| 4,557,794 | 12/1985 | McGinn et al. | 156/612 |
| 4,604,304 | 8/1986 | Faraone et al. | 427/255 |
| 4,658,495 | 4/1987 | Flatley et al. | 29/571 |

OTHER PUBLICATIONS

K. Tanno et al., "Selective Silicon Epitaxy Using Reduced Pressure Technique," Japanese Journal of Applied Physics, vol. 21, No. 9, Sep. 1982, pp. L564–L566.

W. E. Ham, "The Study of Microcircuits by Transmission Electron Microscopy", RCA Review, vol. 38, Sep. 1977, pp. 351–389.

J. S. Chang, "Selective Reactive Ion Etching of Silicon Dioxide," Solid State Technology, Apr. 1984, pp. 214–219.

METHOD OF FORMING AN IMPROVED GATE DIELECTRIC FOR A MOSFET ON AN INSULATING SUBSTRATE

The present invention relates to a method for forming a metal oxide semiconductor field effect transistor (MOSFET) on an insulating substrate. More particularly, the invention relates to a method for forming the gate dielectric of a monocrystalline silicon transistor on a sapphire substrate or of a polycrystalline silicon transistor on an amorphous substrate.

BACKGROUND OF THE INVENTION

A MOSFET is a variety of insulated gate field effect transistor (IGFET) wherein the insulated gate comprises a conductive material such as metal or relatively heavily doped polycrystalline silicon and the gate dielectric comprises an oxide such as silicon dioxide. When it is desired to fabricate a plurality of electrically isolated MOSFETs on a single chip, an insulating substrate is used in preference to a semiconductor substrate. The insulating material of such a substrate may be monocrystalline, as with sapphire, beryllia or spinel, or may be amorphous, as with quartz (glass). When an amorphous insulating substrate such as quartz is used, the MOSFETs on the surface thereof are fabricated in appropriately doped islands of polycrystalline silicon and will hereinafter be referred to as poly-on-glass devices. When the MOSFETs are disposed on the surface of a monocrystalline insulating substrate, they are typically fabricated in appropriately doped monocrystalline silicon islands. Such MOSFETs are hereinafter referred to as SOS (silicon-on-sapphire) devices although it should be understood that substrates of beryllia or spinel should exhibit similar characteristics in the context of the subject invention.

In the fabrication of poly-on-glass and SOS devices, following the deposition and definition of one or more silicon islands on the substrate surface, a gate oxide is formed so as to selectively overlie a portion or portions of the silicon island(s). A conductive gate electrode, typically of doped polycrystalline silicon, is then formed over the gate oxide so as to be capacitively coupled with a portion of the underlying silicon island. A high quality device requires a high quality insulated gate which in turn requires a high quality silicon dioxide dielectric. However, despite a variety of modifications suggested in conventional fabrication processes, non-uniform gate dielectric strength remains a problem.

Examples of conventional approaches to improving gate dielectric strength may be found in U.S. Pat. No. 3,974,515, IGFET ON INSULATING SUBSTRATE, A. C. Ipri et al., Aug. 10, 1976; U.S. Pat. No. 4,341,569, SEMICONDUCTOR ON INSULATOR LASER PROCESS, G. Yaron et al., July 27, 1982; U.S. Pat. No. 4,368,085, SOS ISLAND EDGE PASSIVATION STRUCTURE, J. L. Peel, Jan. 11, 1983; and U.S. Pat. No. 4,242,156, METHOD OF FABRICATING AN SOS ISLAND EDGE PASSIVATION STRUCTURE, J. L. Peel, Dec. 30, 1980. In an effort to overcome the gate dielectric strength problems that remain despite the suggestions of the prior art, the method of the present invention was conceived.

SUMMARY OF THE INVENTION

A method for forming a silicon dioxide layer on a silicon island on an insulating substrate includes the steps of initially providing an insulating substrate having a major surface on which a silicon island is disposed. The surface of the silicon island is then thermally oxidized and a silicon layer is deposited on the oxidized island and the portion of the substrate surface adjacent to the island. The entire silicon layer is then oxidized and a conductive polycrystalline silicon electrode is deposited thereon.

DETAILED DESCRIPTION OF PREFERRED EMBODIMENT

Figure 1:
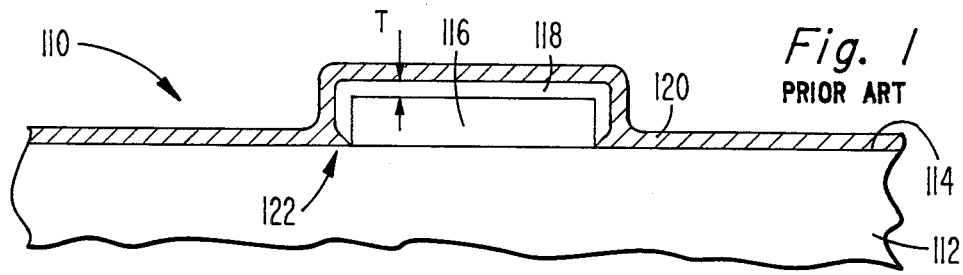
FIGS. 1, 2, 3A, 3B and 4 represent sectional views of conventional SOS structures which illustrate known approaches to the gate dielectric strength problem described herein.

FIG. 1 is a sectional view of the pertinent portion of a conventionally processed silicon-on-sapphire device 110. The device 110 comprises a sapphire wafer 112 having an substantially planar surface 114 on which a monocrystalline silicon island 116 is disposed. The illustrated portion of the monocrystalline silicon island 116 is that portion which is to be capacitively coupled with an overlying insulated gate electrode, i.e., it is that portion of the device 110 in which an inversion channel will be formed during appropriate electrical biasing of the overlying insulated gate electrode. The monocrystalline silicon island 116 is thermally oxidized so as to form a silicon dioxide layer 118 on the exposed surface thereof and a conductive gate electrode 120 of doped polycrystalline silicon is disposed over the silicon dioxide layer 118 and the adjoining portion of the wafer surface 114.

The nature of the thermal oxidation process used to form the gate dielectric 118 yields a silicon dioxide layer which is not uniformly thick in the vicinity of the wafer surface 114 compared to its thickness on other portions of the monocrystalline silicon island 116. This non-uniformity, as illustrated at 122, is a significant thinning of the silicon oxide layer 118 at the boundary between the silicon island 116 and the surface 114 and significantly degrades the dielectric strength of the gate dielectric 118. The dielectric strength of layer 118 is approximately 33% of what a thermally grown silicon dioxide layer of thickness T should yield.

Figure 2:
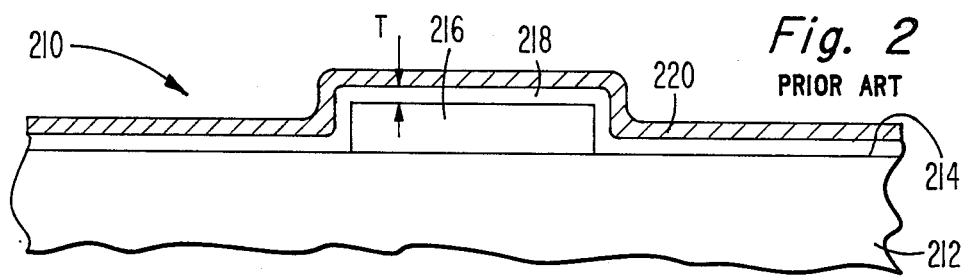

In an effort to overcome the localized gate oxide thinning 122 of the device 110, the process represented by the structure 210 of FIG. 2 was developed. As with the device 110, the device 210 includes a sapphire substrate 212 having a major surface 214 on which a monocrystalline silicon oxide island 216 is disposed. The device 210 also incorporates a silicon dioxide gate dielectric layer 218 of thickness T. However, the gate dielectric layer 218 of device 210 differs from the layer 118 of device 110 in that it is continuous and substantially uniformly thick both over the silicon island 116 and on the wafer surface 214.

In the device 210, the gate dielectric layer 218 is fabricated by depositing a polycrystalline silicon layer, by standard deposition techniques, over the exposed surfaces of the island 116 and surface 214. The polycrystalline silicon layer is then completely thermally oxidized so as to yield the silicon dioxide gate dielectric layer 218. A conductive polycrystalline gate electrode 220 is then conventionally deposited on the surface of the gate dielectric layer 218. Since the structure of device 210 does not incorporate the thin dielectric regions 122 of device 110, it was expected that a significantly better dielectric strength would be exhibited for this structure. However, the resulting dielectric strength was only marginally better than that of device 110.

Figure 3A:
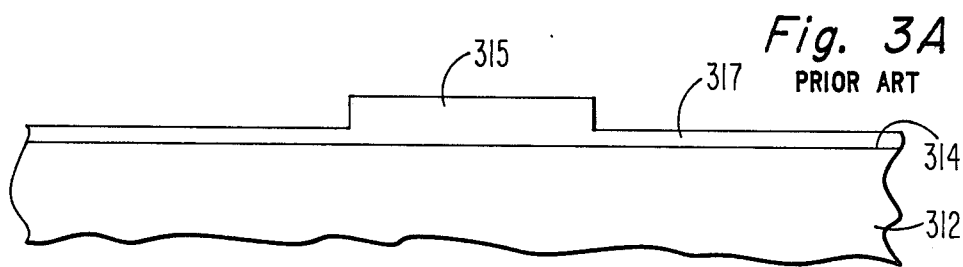
Figure 3B:
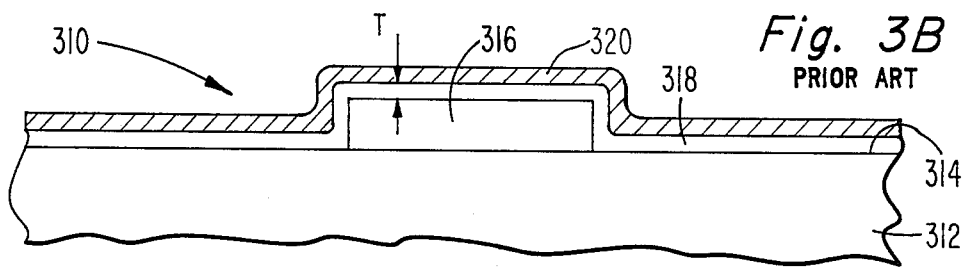

A third gate dielectric fabrication technique attempted is illustrated in the processing sequence of FIGS. 3A and 3B. In this structure, a sapphire substrate 312 having a major surface 314 is provided. A monocrystalline silicon layer is then epitaxially formed on the surface 314 and photolithographically patterned and etched so as to yield a relatively thick portion 315 and relatively thin portion 317 contiguous therewith. The location of the relatively thick portion 315 corresponds to an area where a monocrystalline silicon island is ultimately desired. The relatively thin monocrystalline portion 317 has a thickness in the range of approximately 100–300 Angstroms and covers all portions of the surface 314 not covered by the relatively thick portion(s).

All of the exposed surface of the monocrystalline silicon, i.e., the surfaces of the thick and thin portions 315 and 317, are then thermally oxidized so as to yield a monocrystalline silicon island 316 which is covered by and surrounded by a gate dielectric layer 318 as shown in FIG. 3B. In this process, the entire thickness of the thin portion 317 of the deposited monocrystalline silicon is consumed in the thermal oxidation process which forms the gate dielectric layer 318. A doped polycrystalline silicon gate electrode 320 is then conventionally formed on the surface of the gate dielectric layer 318 to complete the gate electrode structure of the device 310.

The dielectric strength of the gate oxide 318 of the device 310 is significantly better than the corresponding dielectric strengths of devices 110 and 210. However, the process of FIGS. 3A and 3B is difficult to control and produces erratic results. In order to achieve a gate dielectric thickness T in the device 310 of FIG. 3B, the thickness of the thin portion 317 of the monocrystalline silicon layer of FIG. 3A must be no greater than one-half T. This is because of the known phenomenon that the final thickness of a thermally-grown oxide is twice that of the silicon starting material. Thus, for example, when the typical thickness T of the gate oxide layer 318 is approximately 500 Angstroms, a typical value for MOSFET integrated circuits, the thickness of the thin portion 317 can be no more than approximately 250 Angstroms.

Figure 4:
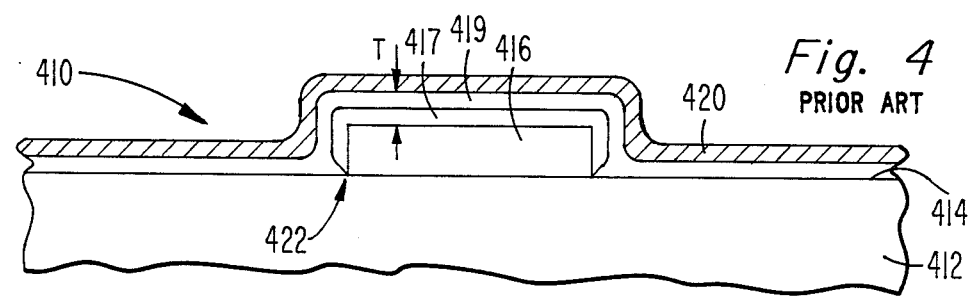

In a fourth conventional technique for improving dielectric strength, the process represented by the structure 410 of FIG. 4 was developed. The structure 410 includes a sapphire substrate 412 having a major surface 414 on which a monocrystalline silicon island 416 is disposed. In the process used to fabricate the structure 410, the monocrystalline silicon island 416 is first thermally oxidized so as to yield a silicon dioxide layer 417 therearound. As with the device 110, the thermally grown silicon dioxide layer 417 includes a characteristic thin portion 422 at the boundary between the monocrystalline silicon island 416 and the surface 414. A layer of silicon nitride 419 is then disposed over the silicon dioxide layer 418 as well as the exposed portions of the wafer surface 414 such that the combined thickness of layers 417 and 419 overlying the island 416 is equal to the desired dielectric layer thickness T. A doped polycrystalline silicon gate electrode layer 420 is then disposed by conventional means over the silicon nitride layer 419. Although the structure 410 also presents an improvement in dielectric strength compared to the devices 110 and 210, it is inherently more unreliable due to the presence of a gate dielectric which comprises two dissimilar materials.

Figure 5A:
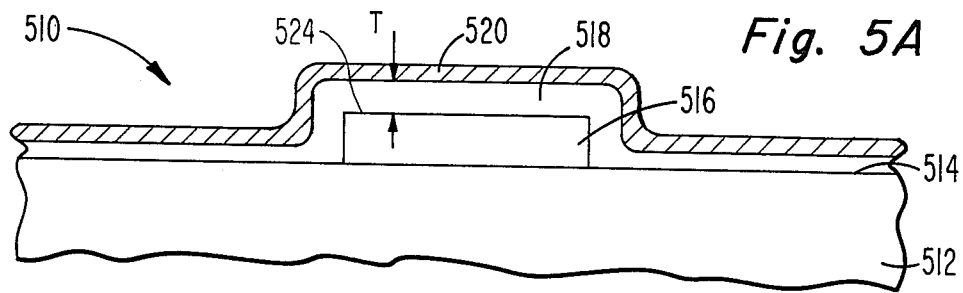
FIG. 5A is a sectional view of an SOS or poly-on-glass device fabricated by the method of the present invention.

In contrast to the various methods of the prior art, the structure obtained by the process of the present invention, as illustrated at 510 in FIG. 5A, provides a reliable, high quality dielectric film that can readily be manufactured utilizing standard fabrication techniques. The device 510 includes a substrate 512 of an insulating material which may be monocrystalline, such as sapphire, beryllia or spinel, or amorphous, such as glass. The substrate 512 has a major surface 514 on which a silicon island 516 is disposed. The silicon island 516 is polycrystalline when the substrate 512 is amorphous and it is typically monocrystalline although it may be polycrystalline when the substrate 512 is monocrystalline. Overlying the silicon island 516 and the wafer surface 514 contiguous therewith is a silicon dioxide gate dielectric 518 having a thickness T in that portion which overlies the silicon island 516. A conductive gate electrode 520 of doped polycrystalline silicon overlies the gate dielectric 518.

Figure 5B:
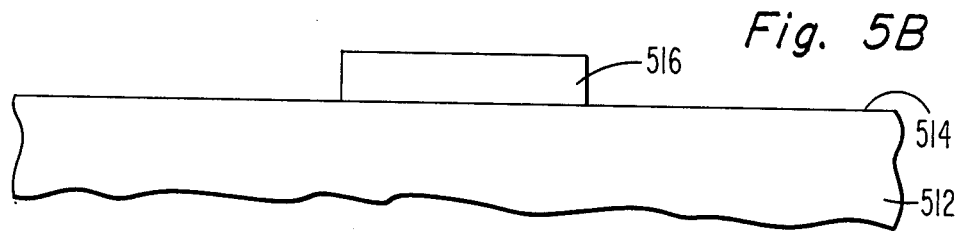
FIGS. 5B–5E are sectional views which illustrate the process sequence that yields the structure of FIG. 5A.
Figure 5C:
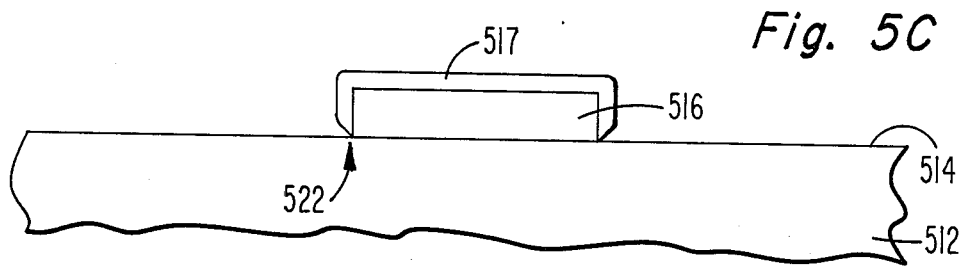

The fabrication sequence for the device 510 basically starts with the deposition and photolithographic definition of the silicon island 516 on the surface 514 as shown in FIG. 5B. The silicon island 516 is then thermally oxidized so as to yield a silicon dioxide layer 517 on all exposed surfaces thereof, as shown in FIG. 5C. The thickness of the silicon dioxide layer 517 is nominally approximately 100–400 Angstroms, although it should be noted that this thickness is characteristically reduced at the boundary between the island 516 and wafer surface 514 as shown at 522.

Figure 5D:
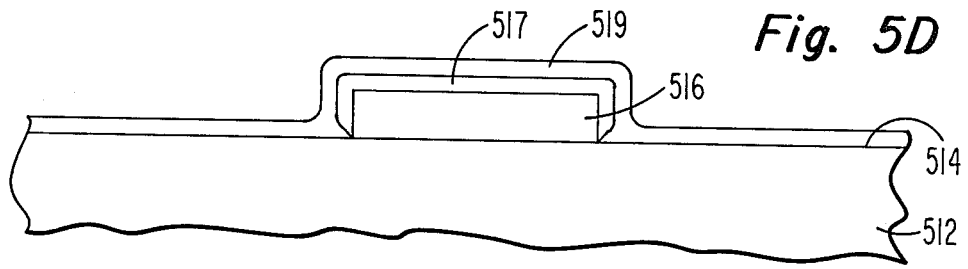
Figure 5E:
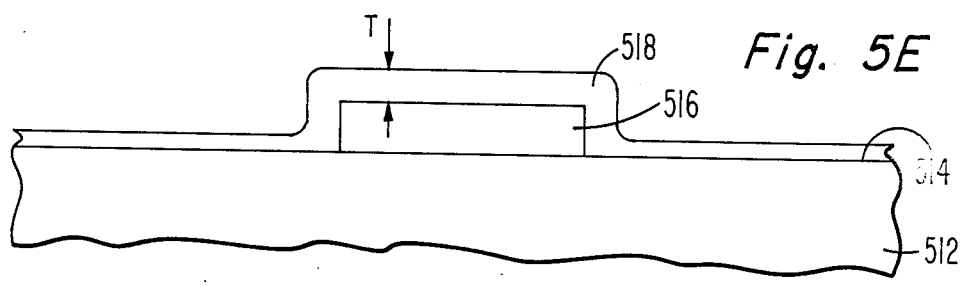

A layer of silicon 519 is then conventionally deposited over the silicon dioxide layer 517 as well as the exposed area of the wafer surface 514 as shown in FIG. 5D. In the preferred embodiment the silicon of layer 519 is polycrystalline, although it may alternatively be amorphous or substantially monocrystalline if so desired. The nominal thickness of the polycrystalline silicon layer 519 is approximately 100–400 Angstroms. The polycrystalline silicon layer 519 is then completely oxidized so as to yield a monolithic silicon dioxide gate dielectric 518 which overlies the island 516 and covers the wafer surface 514. The thickness of the silicon dioxide gate dielectric 518 over the island 516 is T, as shown in FIG. 5E. The doped polycrystalline silicon gate electrode 520 is then conventionally formed on the gate dielectric 518 so as to yield the structure of FIG. 5A.

Electrical tests of the dielectric strength of the silicon dioxide gate dielectric 518 in the structure 510 have yielded values which are substantially equal to the theoretical value for a thermally grown oxide of thickness T. Thus, despite certain structural similarities to the devices 110 and 210 of the prior art, the structure 510 fabricated in accordance with the method of the present invention is far superior. It is theorized that the superior structure occurs because of the relatively smooth silicon/silicon dioxide interface 524 which the process of the present invention yields. That is, there is an apparent correlation between the surface roughness of the underlying silicon island 516, as manifested in the roughness of the silicon/oxide interface 524, and the dielectric strength of the silicon dioxide layer 518.

It is further here recognized that when a polycrystalline silicon film is oxidized so as to form a silicon dioxide layer, the surface of an underlying silicon island is roughened. Apparently, this inherently occurs when a polycrystalline silicon film is oxidized due to the non-uniform oxidation thereof. All portions of a polycrystalline silicon film will not oxidize at the same rate. Rather, when a polycrystalline silicon film is oxidized the oxidation proceeds more quickly along the grain boundaries than within the grains, so as to produce a characteristic "texture." Thus, before the entire polycrystalline silicon film is oxidized, some portion of the underlying silicon island will also be oxidized or "textured."

In the method of the present invention the silicon/oxide interface 524 is formed by thermal growth, not by the transformation to oxide of a polycrystalline silicon layer which overlies a silicon island. Therefore no silicon island surface roughening occurs. In the method of the invention, the polycrystalline silicon layer 519 which is transformed into oxide serves to fill in the relatively thin thermal oxide 517 at the boundary 522 but does not overlie directly the silicon island 516.

What is claimed is:

1. A method for forming an insulated gate electrode on a silicon island on an insulating substrate, comprising:
   providing an insulating substrate having a major surface on which a silicon island is disposed;
   thermally oxidizing the surface of the silicon island;
   depositing a silicon layer on the oxidized island the portion of the substrate surface adjacent thereto;
   oxidizing the entire silicon layer; and
   depositing a conductive polycrystalline silicon electrode on the oxidized silicon layer.

2. A method in accordance with claim 1 wherein said silicon layer comprises polycrystalline silicon.

3. A method in accordance with claim 1 wherein the insulating substrate is an amorphous material.

4. A method in accordance with claim 3 wherein the insulating substrate is glass.

5. A method in accordance with claim 4 wherein the silicon island is polycrystalline.

6. A method in accordance with claim 1 wherein the insulating substrate is a crystalline material.

7. A method in accordance with claim 6 wherein the insulating substrate is a material selected from the group consisting of sapphire, spinel and berylia.

8. A method in accordance with claim 7 wherein the silicon island is monocrystalline.

* * * * *